United States Patent [19]

Fujiwara

[11] Patent Number: 4,873,493

[45] Date of Patent: Oct. 10, 1989

[54] AUDIO AMPLIFIER

[75] Inventor: Nobuo Fujiwara, Yokohama, Japan

[73] Assignee: Victor Company of Japan, Ltd., Yokohama, Japan

[21] Appl. No.: 158,919

[22] Filed: Feb. 19, 1988

[30] Foreign Application Priority Data

Feb. 20, 1987 [JP] Japan .................................. 62-38362
Feb. 20, 1987 [JP] Japan .................................. 62-38363

[51] Int. Cl.$^4$ .............................................. H03G 3/18
[52] U.S. Cl. .................... 330/285; 330/134; 330/136
[58] Field of Search ............... 330/123, 127, 128, 130, 330/134, 136, 267, 273, 285, 296, 297; 360/46, 67, 68; 375/48

[56] References Cited

U.S. PATENT DOCUMENTS 3,720,880 10/1971 Le Seigneur .......................... 330/29
4,498,057 12/1982 Noro ................................... 330/297

FOREIGN PATENT DOCUMENTS 15509 1/1982 Japan ................................ 330/297
59-17710 7/1982 Japan .
60-241302 5/1984 Japan .

OTHER PUBLICATIONS

A. M. Saleh et al, "Improving the power-added efficiency of FET amplifiers operating with varying-envelope signals", IEEE transactions on microwave theory and techniques, vol. MTT-31, No. 1, Jan. 1983, pp. 51–56, IEEE, New York.

*Primary Examiner*—James B. Mullins
*Attorney, Agent, or Firm*—Fleit, Jacobson, Cohn, Price, Holman & Stern

[57] ABSTRACT

An audio amplifier whose operating point and supply voltage can be change in response to a level of an input signal. The audio amplifier includes a delay circuit for delaying an input signal, an amplifier circuit having an amplification device for amplifying an output signal of the delay circuit, the amplifier circuit having a variable operating point, a power supply circuit capable of changing a supply voltage to the amplifier circuit, and a control circuit for detecting a level of the input signal to output a control signal corresponding to the detecting level, and changing the operating point and supply voltage of the amplifier circuit, in response to a level change of the input signal.

7 Claims, 8 Drawing Sheets

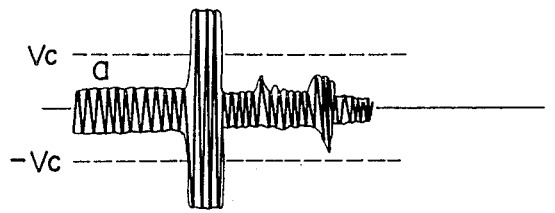
FIG. 3A
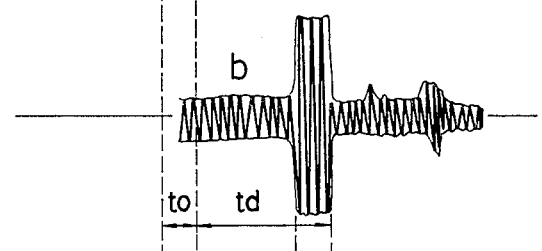
FIG. 3B
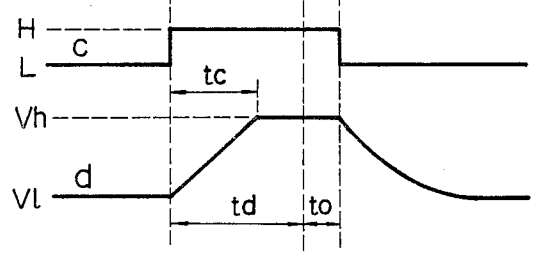
FIG. 3C
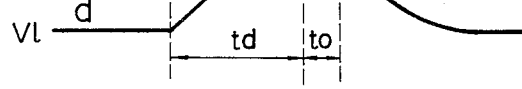
FIG. 3D
FIG. 4
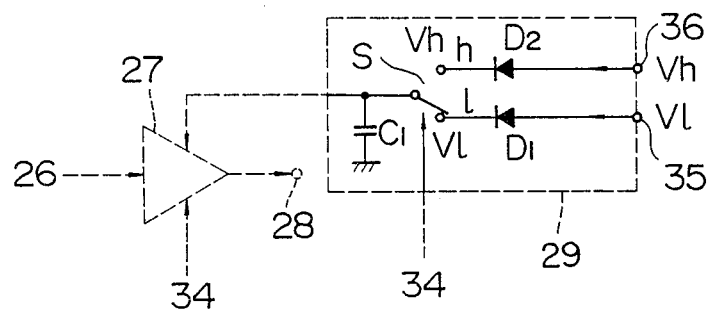

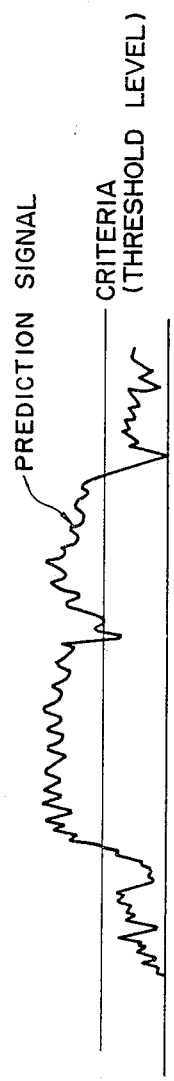
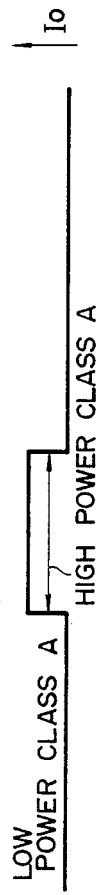
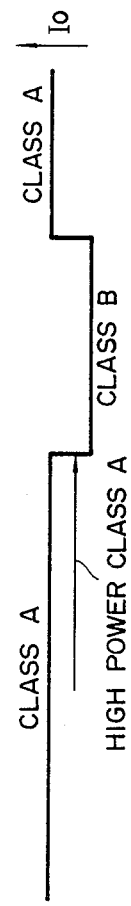
FIG. 7A
FIG. 7B
FIG. 7C
FIG. 7D

200~# AUDIO AMPLIFIER

BACKGROUND OF THE INVENTION

The present invention relates to an amplifier, and more particularly to an amplifier which detects the level of an input signal and changes the operating point of an amplification device of an amplifier circuit and the supply voltage in accordance with the detected input signal level.

Compact disks (CDs) from which digital signals can be reproduced have been widely used nowadays as one source of audio signals, in addition to phonograph records and magnetic tapes in which analog signals are used. Compact disks have various advantageous features in their characteristics, including their dynamic range of ninety and several dB or more.

Thus, it becomes necessary for amplifier circuits to cover a broader dynamic range than the range for conventional sources. To this end, there is an amplifier circuit designed to have its supply voltage large enough to handle a maximum input signal without clipping it by setting the operating point of an amplification device at an optimum fixed value for such a supply voltage.

However, since the operating point and the supply voltage of such an amplifier circuit are primarily set to handle such a large input signal level with minimum distortion, a large amount of operating current, which would not be needed otherwise, will flow even with a small input signal level.

In addition, as a matter of fact, the period during which a maximum input signal is driven into the amplifier circuit is relatively short, thus a large amount of idle current will pass through the amplification device of the last stage at most other periods, and this results in unfavorable power consumption, poor amplifier efficiency and durability.

There is an amplifier proposed by the same applicant, which is directed to solve these problems, whereby an analog input signal level applied to the amplifier circuit is detected to control the operating point of an amplification device of the amplifier circuit and control the supply voltage in accordance with the detected input signal level.

With such a proposed amplifier, however, the analog input signal level is detected when it exceeds a predetermined level and in response to the detection, a switch is controlled to supply a higher supply voltage to the amplifier circuit. Therefore, the supply of the higher voltage has an inevitable delay with respect to the excess of the input signal to be detected.

Particularly in the case where the analog input signal is a music signal, the rise in signal level is steep and pulsive, and the time during which a large signal level is applied is very short. Therefore, there arises a problem of causing signal dropouts, distortion and the like.

Further, in order to make a supply voltage rise quickly when it is switched from a lower one to a higher one, it is necessary to have an expensive capacitor of large capacitance, resulting in high cost to the amplifier.

Furthermore, since it is necessary to switch a supply voltage at high speed, semiconductor devices such as a transistor and a diode are used as a high speed switch. However, use of such a semiconductor element and a diode will increase the impedance of the power supply circuit with respect to the operating signal frequencies, thereby deteriorating the sound quality. Moreover, noises are generated from the semiconductor and the diode during switching.

Still further, in determining the operating conditions of the amplifier circuit of a conventional amplifier, it has been solely dependent upon the analog input signal level to be detected. However, in practice, the operating conditions of the amplifier circuit may vary with a manual adjustment of a level adjuster or so-called volume control by a listener even if the analog input signal level is constant. Thus, controlling the operating point of the amplification device of the amplifier circuit and the supply voltage fed to the amplifier circuit based on a detected analog input signal level alone is not adequate and may lead to signal distortion.

SUMMARY OF THE INVENTION

It is, accordingly, an object of the present invention to provide an audio amplifier capable of amplifying an input signal which is a digital signal in particular, without causing signal dropouts and distortion even when an abrupt, pulsive and large amplitude input signal is inputted.

It is another object of the present invention to provide an audio amplifier of low cost without using a large capacitor.

It is a further object of the present invention to provide an audio amplifier without generating noises from switching devices such as transistors.

According to one aspect of the present invention, there is provided an audio amplifier which comprises: a delay circuit for delaying a digital input signal; an amplifier circuit having an amplification device for amplifying an output signal of said delay circuit, said amplifier circuit having a variable operating point; a power supply circuit capable of changing a supply voltage to said amplifier circuit; and a control circuit for detecting a level of said digital input signal to output a control signal corresponding to said level, and changing the operating point of said amplifier circuit and an output voltage of said power supply circuit, in accordance with a level change of said digital input signal.

According to another aspect of the present invention, there is provided an amplifier which comprises: a delay circuit for delaying an input signal to be amplified; an amplifier circuit having an amplification device for amplifying an output of said delay circuit, said amplifier circuit having a variable operating point; a power supply circuit capable of changing a supply voltage to said amplifier circuit; a first peak-detecting circuit for detecting a level of said input signal; a second peak-detecting circuit for detecting a level of an input signal to a level adjuster which regulates a level of an input signal to said amplifier circuit; a third peak-detecting circuit for detecting a level of an output signal of said amplifier circuit; a dividing circuit for dividing an output signal of said third peak-detecting circuit by an output signal of said second peak-detecting circuit; and a multiplying circuit for multiplying an output signal of said dividing circuit by an output signal of said first peak-detecting circuit; whereby the operating point of said amplifier circuit and an output voltage of said power supply circuit are changed in accordance with an output signal of said multiplying circuit.

According to a further aspect of the present invention, there is provided an amplifier which comprises: a delay circuit for delaying an input signal to be amplified; an amplifier circuit having an amplification device for amplifying an output of said delay circuit, said amplifier circuit having a variable operating point; a power supply circuit capable of changing a supply voltage to said amplifier circuit; a first peak-detecting circuit for detecting a level of said input signal; a second peak-detecting circuit for detecting a level of an input signal to a level adjuster which regulates a level of an input signal to said amplifier circuit; a third peak-detecting circuit for detecting a level of an output signal of said amplifier circuit; a dividing circuit for dividing an output signal of said third peak-detecting circuit by an output signal of said second peak-detecting circuit; a multiplying circuit for multiplying an output signal of said dividing circuit by an output signal of said first peak-detecting circuit; and a gate circuit for switching between an output signal of said multiplying circuit and an output signal of said first peak-detecting circuit; whereby the operating point of said amplifier circuit and an output voltage of said power supply circuit are controlled in response to an output signal of said multiplying circuit, when an output signal of said first or second peak-detecting circuits becomes larger than a predetermined level, whereas the operating point of said amplifier circuit and an output voltage of said power supply circuit are changed in response to an output signal of said first peak-detecting circuit, when an output signal of said first or second peak-detecting circuits becomes smaller than a predetermined level.

BRIEF DESCRIPTION OF THE DRAWINGS

In the accompanying drawings,

FIGS. 3A to 3D show waveforms to be used for explaining the operation of the audio amplifier shown in FIG. 2;

FIG. 4 is a circuit diagram showing an example of the power supply circuit shown in FIG. 2;

FIGS. 7A to 7D show waveforms illustrating idle current control;

DETAILED DESCRIPTION OF THE PREFERRED EMBODIMENTS

First, the structure of a conventional amplifier will be described while pointing out its problems.

Figure 1:
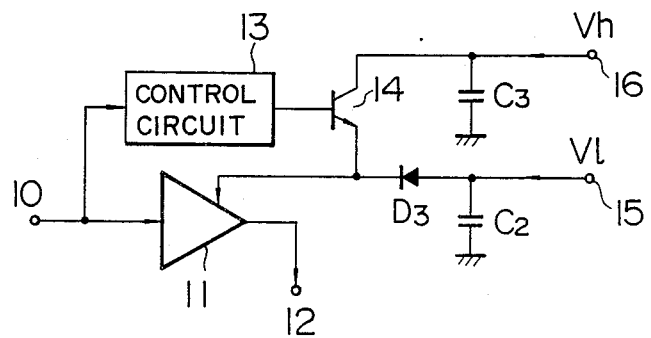
FIG. 1 is a circuit diagram showing a conventional amplifier arrangement with a variable operating point.

FIG. 1 is a circuit diagram of a conventional amplifier. In the Figure, an analog signal such as a music signal applied to an input terminal 10 is amplified by an amplifier circuit 11 and thereafter, it is outputted from an output terminal 12. The analog signal applied to the input terminal 10 is also supplied to a control circuit 13 to discriminate its level. A switch 14 constructed of a transistor is controlled in accordance with the discriminated level.

A DC voltage V1 is supplied from a circuit (not shown) to an input terminal 15, the voltage V1 being fed to the amplifier circuit 11 as its drive power source via one terminal of a capacitor C2 having a large capacitance with its other end grounded and via a forward biased diode D3.

A DC voltage Vh is supplied from a circuit (not shown) to an input terminal 16, the voltage Vh being fed to the amplifier circuit 11 via one terminal of a capacitor C3 having a large capacitance with its other end grounded and via the switch 14. The voltage Vh is higher than the voltage V1.

In the amplifier constructed as above, when a signal applied to the input terminal 10 has a lower level than a predetermined level, the control circuit 13 detects it and causes the switch 14 to open to thereby feed the lower voltage V1 from the input terminal 15 to the amplifier circuit 11.

When a level of a signal applied to the input terminal 10 becomes higher than the predetermined level, the control circuit 13 detects it and causes the switch 14 to close to thereby feed the higher voltage Vh from the input terminal 16 to the amplifier circuit 11. Therefore, the amplifier circuit 11 with the higher voltage Vh amplifies an input signal of high level without clipping it and outputs it to the output terminal 12.

The diode D3 is used for preventing the voltage Vh from being lowered by a charge current flowing from the capacitor C3 to the capacitor C2 when the switch 14 is closed.

The capacitance of the capacitor C3 should be large enough to compensate a possible voltage drop due to a current drawn into the amplifier 11 in response to the input signal when the switch 14 is closed. Thus, two large capacitors including the capacitor C2 become necessary.

Further, the above-described signal dropouts and distortion may occur due to a delay of the switch control.

Figure 2:
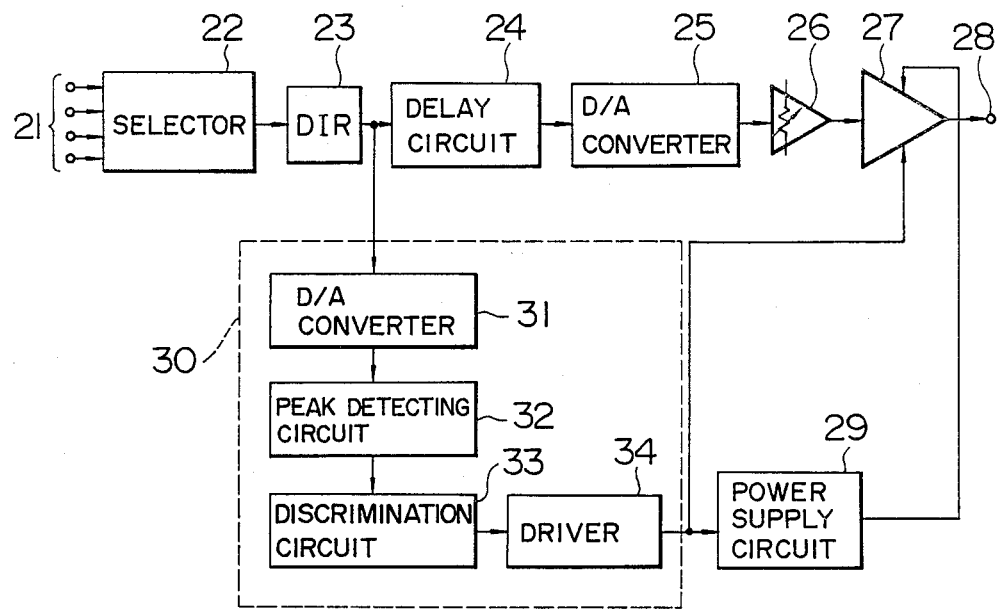
FIG. 2 is a block diagram of an embodiment of an audio amplifier according to the present invention.

FIG. 2 is a block diagram of an embodiment of an amplifier according to the present invention. In the Figure, reference number 21 denotes an input terminal group to which digital signals to be amplified are applied. A signal applied to the input terminal group 21 passes a selector 22, a digital interface receiver (DIR) 23, a delay circuit 24, a digital-to-analog (D/A) converter 25, a level adjuster 26 and an amplifier circuit 27 respectively connected serially, to thereafter be fed to an output terminal 28.

An output signal of DIR 23 is supplied to a control circuit 30. An output signal of the control circuit 30 is supplied to both the amplifier circuit 27 and a power supply circuit 29 whose output voltage is supplied to the amplifier circuit 27.

The control circuit 30 is constructed of a D/A converter 31, a peak-detecting circuit 32, a discrimination circuit 33 and a driver 34 respectively connected in tandem.

The operation of the amplifier will be described. Supplied to the input terminal group 21 are digital signals from, e.g., a compact disk player, a digital audio tape recorder and the like. Of these digital signals, a desired signal is selected by the selector 22. The selected signal is subjected to error correction and serial digital signal conversion by DIR 23. The processed signal is then delayed by time td by the delay circuit 24 and thereafter, it is converted into an analog signal by the D/A converter 25.

Signal a shown in FIG. 3A represents an analog signal version of an input digital signal to the delay circuit 24, and signal b shown in FIG. 3B is an output signal from the D/A converter 25. The analog signal b is level-adjusted by the level adjuster 26, amplified by the amplifier circuit 27, and supplied via the output terminal 28 to a loudspeaker (not shown) or the like to reproduce it as sound.

In the meantime, a signal supplied to the control circuit 30 is converted into an analog signal by the D/A converter 31 and is subjected to full-wave rectification by the peak-detecting circuit 32 to output its value to the discrimination circuit 33 whereat its value is compared with a preset reference value.

In this case, an analog signal to be outputted from the D/A converter 31 may suffice only if it has a signal quality sufficient for the discrimination circuit 33 to enable discrimination of the signal level. Therefore, upper half bits or so of a digital signal may be used by the D/A converter 31 to convert them into such an analog signal.

When the level of signal a becomes larger than the preset value Vc, the discrimination circuit 33 detects it and sends a signal to the driver 34, to generate pulse signal c having a logical value H as shown in FIG. 3C having a duration of t0+td. The time t0 is a period while the signal level is higher than the preset value Vc, and the time td is a delay caused by the delay circuit 24.

Upon reception of this pulse signal c, the power supply circuit 29 changes its supply voltage to the amplifier circuit 27.

FIG. 4 shows a rectifier circuit 29' constituting a part of the power supply circuit 29. In the Figure, a switch S is connected to the l side while signal c is logical low level L, and to the h side while signal c is logical high level H.

During the period while switch S is connected to the l side, a DC voltage Vl obtained by rectifying the AC voltage Vl by the diode D1 and smoothed by the capacitor C1 is supplied to the amplifier circuit 7.

When switch S turns from the l side to the h side, the AC voltage Vh (Vl<Vh) supplied from the input terminal 36 is rectified by the diode D2 and supplied as a DC voltage Vh to the capacitor C1.

As a voltage across the capacitor C1, a signal d rising for a period tc as shown in FIG. 3D is obtained. The period tc is set within the delay time td by determining beforehand the impedance of the rectifier circuit in consideration of the capacitance of the capacitor C1.

Simultaneously with switching the supply voltage, the operating point of the amplification elements of the amplifier circuit 27, e.g., an idle current of the output stage elements, is changed by the signal of logical high level H from the driver 34 so as to coincide with the switching of the supply voltage.

As above, by delaying a digital input signal to be amplified, the input signal level is detected prior to amplifying it so that the operating point of the amplification device of the amplifier circuit and the supply voltage can be set at most desirable values. Thus, an output signal with high power efficiency and without signal dropouts and distortion can be obtained.

Figure 5:
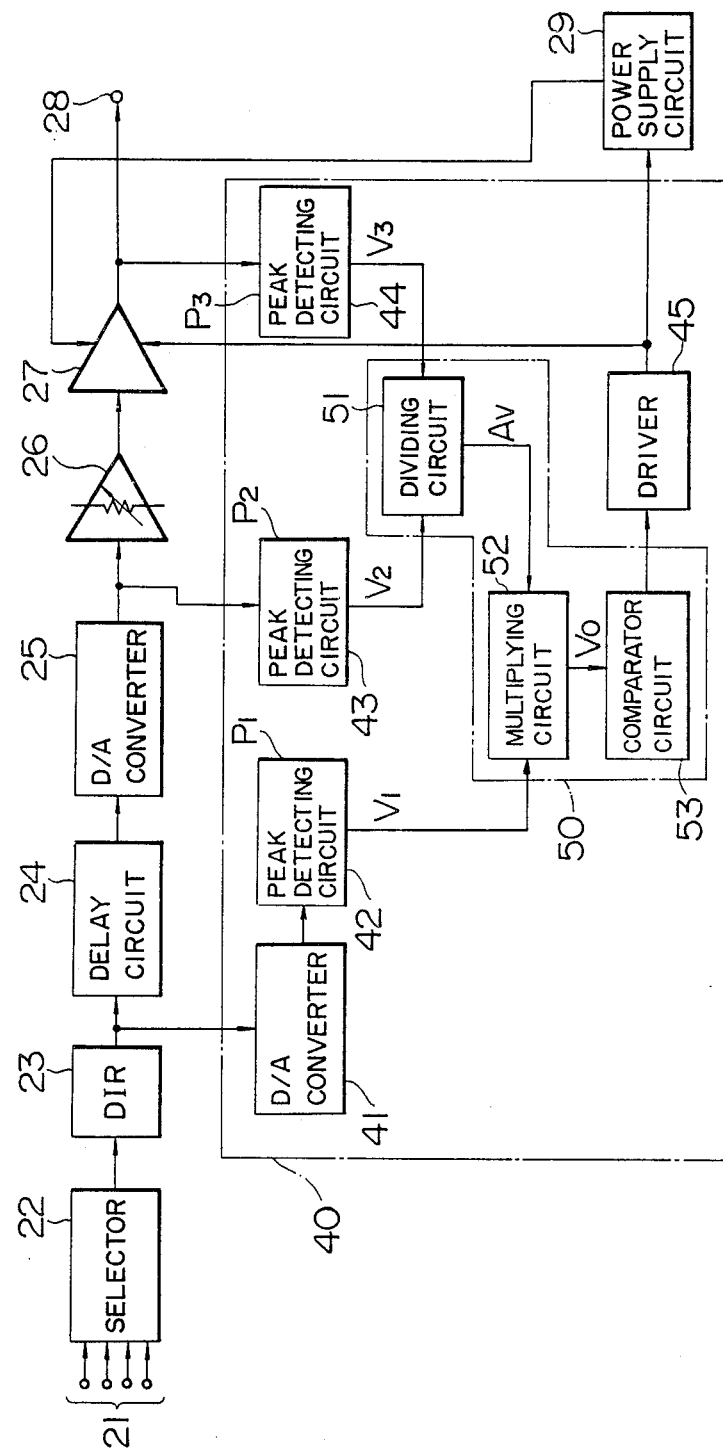
FIG. 5 is a block diagram of another embodiment of an audio amplifier according to the present invention.

FIG. 5 is a block diagram of another embodiment of an audio amplifier according to the present invention, wherein like elements to those shown in FIG. 2 are represented by using identical reference numbers and the description therefor is omitted.

An output of a DIR 23 is applied to a control circuit 40 whose output is supplied to both an amplifier circuit 27 and a power supply circuit 29. This circuit arrangement is generally the same as that shown in FIG. 2. However, the structure of the control circuit 40 is different from that of the control circuit 30 shown in FIG. 2.

The control circuit 40 is constructed of a D/A converter 41, peak detecting circuits 42, 43 and 44, a discrimination circuit 50 and a driver 45. The discrimination circuit 50 is constructed of a dividing circuit 51, a multiplying circuit 52 and a comparator circuit 53.

An output signal of DIR 23 is supplied via the D/A converter 41 to the peak-detecting circuit 42. An output signal of the D/A converter 25 is supplied to the peak-detecting circuit 43. An output signal of the amplifier circuit 27 is supplied to the peak-detecting circuit 44.

A signal supplied form DIR 23 to the control circuit 40 is converted into an analog signal by the D/A converter 41 and thereafter passed to the peak-detecting circuit 42 to output therefrom a full-wave rectified value.

Output signals of the D/A converter 25 and the amplifier circuit 27 are supplied to the peak-detecting circuits 43 and 44, respectively, and the full-wave rectified values therefrom are sent to the dividing circuit 51.

Assuming that the values sent from the peak-detecting circuits 42 to 44 are V1 to V3, respectively, the overall amplification factor Av of the level adjuster 26 and the amplifier circuit 27 is obtained by dividing V3 by V2 by means of the dividing circuit 51.

This amplification factor Av varies with a manipulation of the level adjuster 26 or so-called volume control by the listener, a changed amplification factor Av being calculated as described above.

The multiplying circuit 52 multiplies the value V1 sent from the peak-detecting circuit 42 by the amplification factor Av to obtain a prediction signal Vo which corresponds to the output signal of the amplifier circuit 27 with the delay period td.

The output signal Vo is compared with a preset reference value by the comparator circuit 53.

Considering a fact that the discrimination circuit 50 is often constituted from integrated circuit devices (IC chips) of which operating voltages are limited, the levels of V1, V2, and V3 need to be optimized.

For this reason, V1 and V2 when outputted from the peak detecting circuits 42 and 43 respectively, are multiplied by a coefficient 3.2, while V3 is multiplied by a coefficient of 0.18 when outputted from the peak detecting circuit 44.

When the comparator circuit 53 judges that the output signal level Vo reaches the preset value, it sends a detect signal to the driver 45, to generate a pulse signal c of logical high level H having a time of t0+td as shown in FIG. 3C, where t0 represents the period while the signal level is higher than the preset value, and td is a delay time at the delay circuit 24. Upon reception of the pulse signal c, the power supply circuit 29 changes its supply voltage to the amplifier circuit 27.

Figure 6:
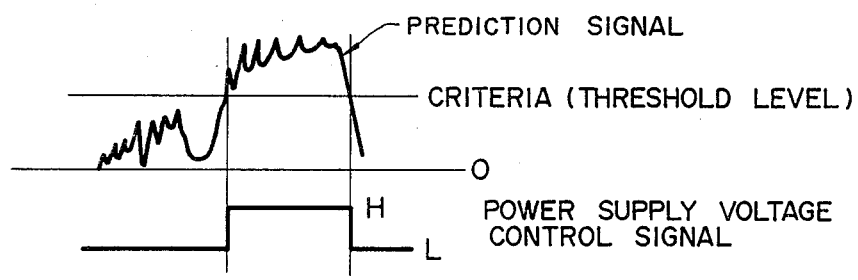
FIG. 6 shows a waveform illustrating a discrimination reference used for supply voltage control.

FIG. 6 shows a waveform of the prediction signal Vo in relation to a power supply voltage control signal generated according to a threshold level set at the comparator circuit 53.

If the power supply circuit 29 is a bistate system which delivers two (2) levels of supply voltages switchably in response to the control signal, a switching criteria i.e. the threshold level for the prediction signal may be chosen to the level which causes the amplifier circuit 27 to produce after the delay period td, a maximum output with tolerable distortion operated under the lower supply voltage of the two. Accordingly, when a prediction signal Vo from the multiplying circuit 52 shown in FIG. 5 exceeds the threshold level, the driver 45 outputs an H level signal to switch the supply voltage to the higher one. This prevents signal dropouts on saturation namely a waveform distortion.

Similarly, for the control of an idle current (I0) of the amplifier circuit 27, the power supply voltage control signal is used as an idle current control signal as shown in FIG. 7B, which is outputted from the driver 45 in response to the prediction signal exceeding the threshold level.

Using the idle current control signal, it is possible to control such as the class A operation of the amplifier circuit. Various other controls may be possible, such as, in the case shown in FIG. 7C, a high power class A operation takes place within a certain time period which may correspond to a waveform rising period significant to music perception. In the case shown in FIG. 7D, the amplifier circuit is kept at most of the time in the high power class A operation and is switched to the class B operation at a predetermined period for better operational efficiency, thermal stability or other reasons.

Figure 8:
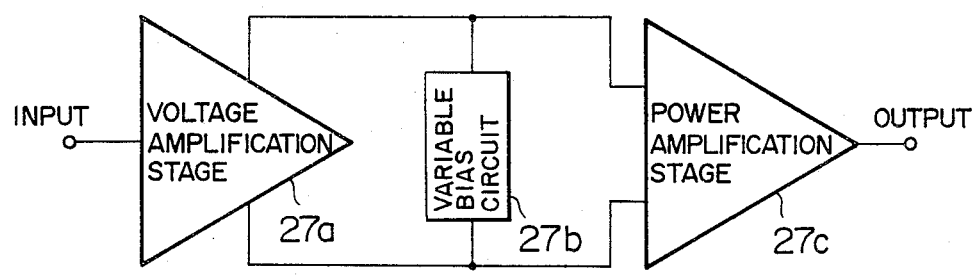
FIG. 8 is a block diagram of an audio amplifier.

FIG. 8 is a conceptional diagram showing the amplifier circuit 27, wherein provided between a voltage amplifier stage 27a and a power amplifier stage 27c is a variable bias circuit which is controlled by the idle current control signal to change the operating point of the amplifier circuit which thus controls the idle current thereof.

Figure 9:
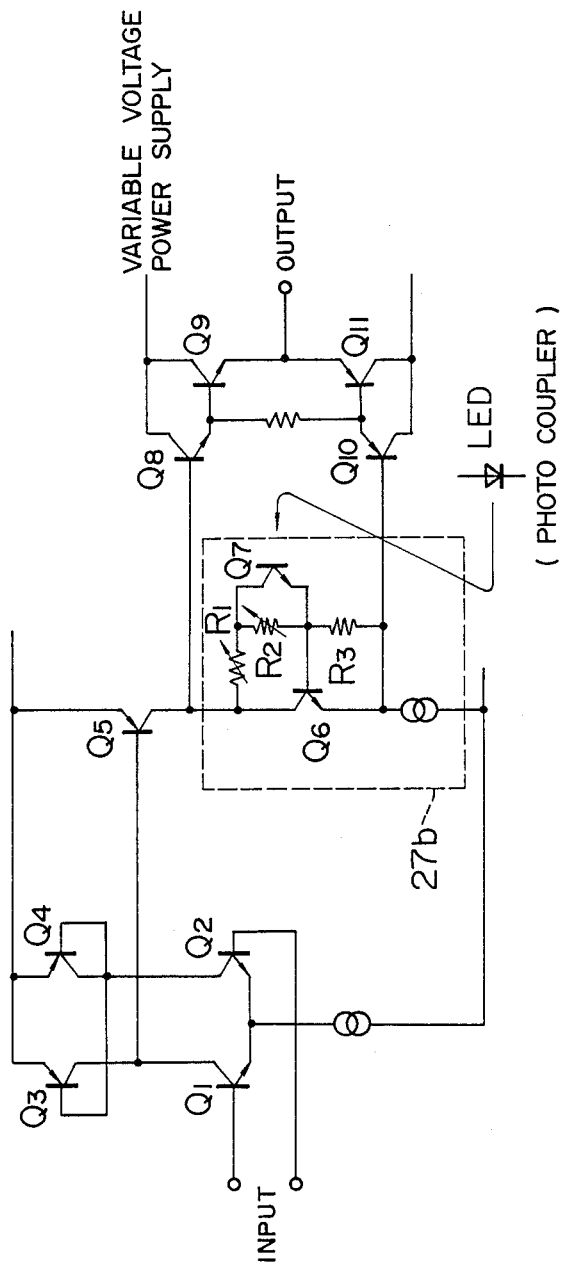
FIG. 9 is a detailed circuit diagram of the amplifier shown in FIG. 8.

FIG. 9 is a detailed circuit diagram of the amplifier circuit 27 having a variable bias circuit 27b for changing a bias voltage of a differential amplifier constructed of transistors Q1 to Q4. The variable bias circuit is a so-called $V_{BE}$ multiplier. In this circuit, since a current passing through R3, corresponding to $V_{BE}$ of Q6, flows through R1 and R2, a potential $V_{CE}$ given by $$V_{CE} \doteq V_{BE}(R1+R2+R3)/R3$$

is generated across the collector-emitter of Q6, the potential $V_{CE}$ being called a bias voltage. This circuit changes the bias voltage by turning on and off a phototransistor (Q7) and hence changing the value of R2 to the same effect.

The photoresistor (Q7) and a light emitting diode LED constitute a photo-coupler which is driven by the output of the drivers 45 through an interface unit (not shown).

Namely, bias voltage at Q7 OFF...
$$V_{CE} \doteq V_{BE}(R1+R2+R3)/R3$$

bias voltage at Q7 ON... $V_{CE} \doteq V_{BE}(R1+R3)/R3$

Figure 10:
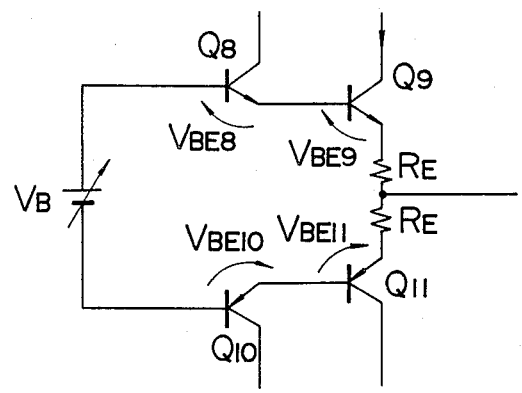
FIG. 10 is an equivalent circuit of the output stage of the audio amplifier shown in FIG. 9.

The output stage of the amplifier circuit is constructed of two pairs of Darlington-connected transistors Q8 and Q9, and Q10 and Q11. The equivalent circuit of this circuit portion is shown in FIG. 10. In the Figure, since a voltage ($V_{RE}$) appearing at an output resistor $R_E$ is given by $$2V_{RE}=V_B-(V_{BE8}+V_{BE9}+V_{BE10}+V_{BE11}),$$

a current I0 flowing through Q9 and Q11 becomes $$I0=[V_B-(V_{BE8}+V_{BE9}V_{BE10}+V_{BE11})/2R_E.$$

Thus, it can be understood that I0 varies with a change of $V_B$.

Figure 11:
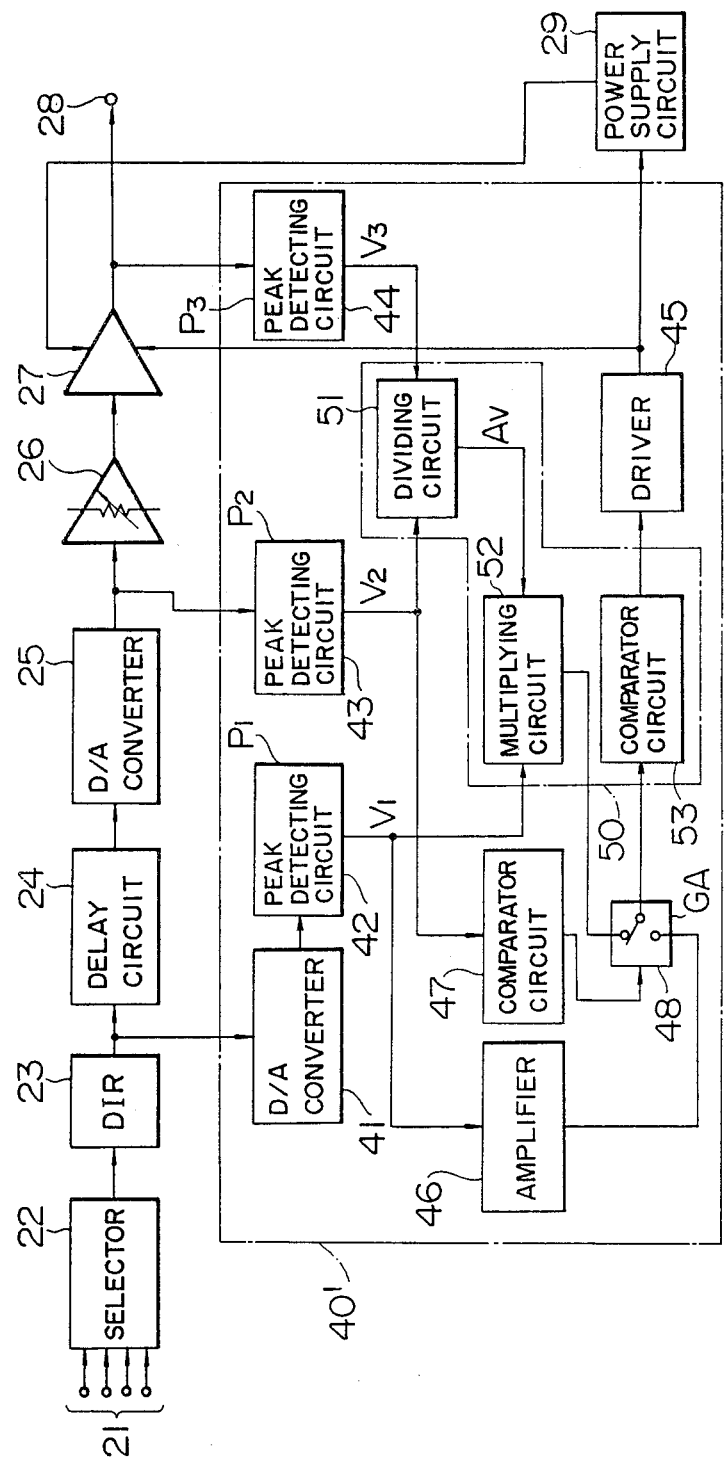
FIG. 11 is a block diagram of a further embodiment of an audio amplifier according to the present invention.

FIG. 11 is a block diagram of a further embodiment of an audio amplifier according to the present invention. Although the circuit arrangement is similar to that shown in FIG. 5, a control circuit 40' is different from the control circuit 40 of FIG. 5.

The control circuit 40' is constructed of the D/A converter 41, peak-detecting circuits 42 to 44, discrimination circuit 50 and driver 45, all included in the control circuit 40'. The control circuit 40' includes a comparator circuit 47, an amplifier circuit 46 and a gate circuit 48, as well as the dividing circuit 51, multiplying circuit 52 and comparator circuit 53. Output signals of the peak-detecting circuits 42 and 43 are supplied to the amplifier circuit 46 and the comparator circuit 47, respectively. Output signals of the amplifier circuit 46 and the multiplying circuit 52 are supplied to two input terminals of the gate circuit 48, respectively.

An output signal of the comparator circuit 47 is supplied to a control terminal (not shown) of the gate circuit 48, that of the gate circuit 48 is supplied via the comparator circuit 53 to the driver 45, and that of the driver 45 is supplied as an output signal of the control circuit 40' to the amplifier circuit 27 and the power supply circuit 29.

The control circuit 40' of FIG. 11 performs basically the same operation as that of FIG. 5. A main difference therebetween is that an output of the multiplying circuit 52 is not directly inputted to the comparator circuit 53 but it is inputted thereto by way of the gate circuit 48.

It is assumed now that the gate circuit 48 passes an output signal of the multiplying circuit 52 in response to a control signal from the comparator circuit 47. Then, the output signal Vo is compared with a reference value preset at the comparator circuit 53.

Concurrent to the output signal Vo taking a high value, the peak-detecting circuit 44 sends out a value multiplied by a coefficient 0.18 while considering the operating voltage of ICs and the like constituting the discrimination circuit 50. On the other hand, since the signal level prior to amplification takes a low value, the peak-detecting circuits 42 and 43 send out values multiplied by a coefficient 3.2.

When the comparator circuit 53 judges that the signal Vo reaches the preset value, it sends a detecting signal to the driver 45, to generate a pulse signal c of logical high level H having a duration of t0 +td as shown in FIG. 3C, where t0 represents the period while the signal level is higher than the preset value, and td is a delay time at the delay circuit 24. Upon reception of the pulse signal c, the power supply circuit 29 changes its supply voltage to the amplifier circuit 27.

In case where no input signal is applied to the input terminal group 21, or where an input signal is a music signal of piannisimo, the output signal levels of the peak-detecting circuits 42 and 43 are practically zero or near zero.

Consequently, the operation of the multiplying circuit 52 and the dividing circuit 51 is likely to become unstable. Also, since the output signal level of the amplifier circuit 27 is low at the time, it is unnecessary to perform the calculation and prediction for the bias and power supply control.

In view of this, this circuit is so arranged that the result of the calculation namely the prediction signal Vo is used only while the input signal to the level adjuster 26 exceeds a predetermined level.

In this embodiment, the gate circuit 48 is so controlled to pass the prediction signal Vo of the multiplying circuit 52 when the comparator circuit 47 detects that the level of the output signal of the peak-detecting circuit 43 becomes more than a predetermined level.

On the other hand, when the output signal of the peak-detecting circuit 43 becomes below the predetermined level detected by the comparator circuit 47, the gate circuit 48 is controlled to block the prediction signal Vo and pass the output signal of the amplifier 46 so that an amplified value V1 is fed to the comparator circuit 53 to switch the bias and the power supply voltage for the amplifier circuit 27. Considering the maximum overall gain of the amplifier 27 and the level adjuster 26 the predetermined level i.e. a threshold level of the comparator circuit 47 is chosen so that when the level of input signal to the audio amplifier is increasing, the switching of power supply voltage takes place in response to the amplified value V1 before the value Vo triggers the comparator circuit 47 to operate the gate circuit 48 to switch. Further increase of the level of input signal causes the value V2 to exceed the predetermined level thereby the comparator circuit 47 is triggered to operate the gate circuit 48 to switch so that the prediction signal Vo takes over the amplified value V1. This arrangement assures that the amplifier circuit 27 has less chance to be overdriven with a minute and instantaneous peak of the input signal which may not be detected by the peak-detecting circuit 43.

Figure 12:
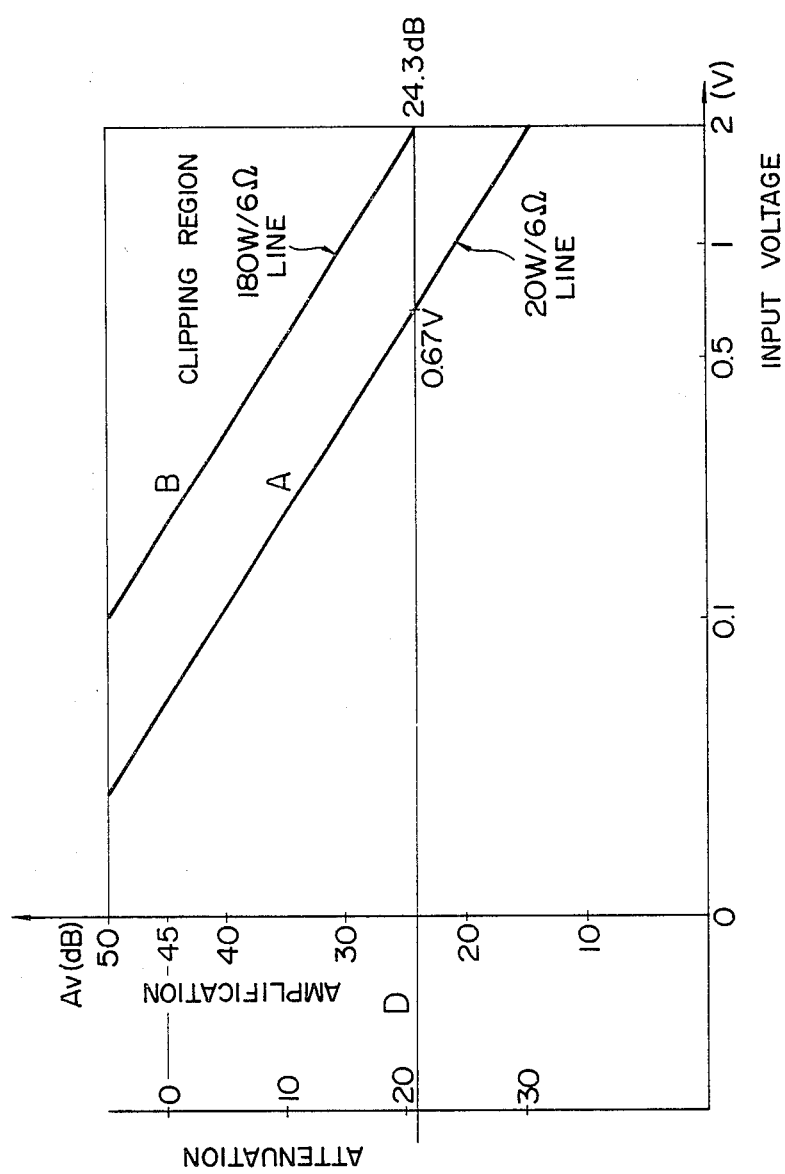
FIG. 12 is a graph showing clipping area.

FIG. 12 shows typical operating conditions of the audio amplifier shown in FIG. 11 in which a maximum amplification of the amplifier circuit 27 is 45 dB with the level adjuster set at −20.7 dB so that the overall gain is 24.3 dB indicated by the reference line D.

The abscissa in FIG. 12 represents an input voltage to the level adjuster 26, and the ordinate represents an overall amplification factor of the amplifier circuit 27 along with an attenuation factor of the level adjuster 26. In the Figure, a straight line A is a line showing an output voltage of 10.95 V (20W/6Ω) obtained at the output terminal 28 under the lower supply voltage. When the output voltage exceeds the straight line A, the comparator circuit 53 operates to change the supply voltage and operating point of the amplifier circuit 27.

A straight line B is a line showing an output voltage of 32.86 V (180W/6Ω), which line indicates that an output voltage appearing at the output terminal 28 under the higher supply voltage. A signal clipping or dropouts occurs at the area above the line B. For instance, assuming that a maximum input voltage is 2 V limited by the ratings of the D/A converter 25, as the gain of the amplifier circuit 27 is 45 dB, and the level adjuster is set to minus 20.7 dB, there occurs no clipping at the amplifier circuit under the higher supply voltage.

On the other hand, under the lower supply voltage, clipping would occur if the input voltage exceed 0.67 V. In view of the above, the gate circuit 48 is arranged to pass through an output signal of the amplifier circuit 46 when the level Vo is detected by the comparator circuit 47 as exceeding the predetermined level which corresponds, in this case, with 0.67 V of input voltage to the level adjuster 26 that the output signal becomes lower than 0.67 V.

The number of voltage steps of the power supply circuit 29 in the above embodiments is two. However, the voltage step number may be increased as the discrimination steps of the discrimination circuit 50 are increased.

Further, the description in the foregoing is directed generally to a digital input signal, but the present invention can apply to an analog input signal by corresponding the elements proprietary to digital signal processings such as digital, interface receiver 23 and D/A converters 25, 31 and 41.

What is claimed is:

1. An audio amplifier for amplifying an input signal thereto comprising:
   a delay circuit for delaying the input signal;
   an amplifier circuit having an amplification device for amplifying an output signal of said delay circuit, said amplifier circuit having a variable operating point;
   a power supply circuit capable of changing a supply voltage to said amplifier circuit; and
   a control circuit for detecting a level of said input signal to output a control signal corresponding to said level, said control signal being coupled to said amplifier circuit for changing the operating point of said amplifier circuit and being also coupled to said power supply circuit for changing said supply voltage to said amplifier circuit in response to a level change of said input signal.

2. The audio amplifier according to claim 1, wherein said input signal is a digital input signal, and said amplifier further comprises a first digital-to-analog converter connected between said delay circuit and said amplifier circuit.

3. The audio amplifier according to claim 2, wherein said control circuit comprises:
   a second digital-to-analog converter for converting said digital input signal into an analog signal
   a peak-detecting circuit for detecting a peak value of an output signal of said second digital-to-analog converter; and
   a discrimination circuit for comparing an output signal of said peak-detecting circuit with a preset value to generate said control signal by which said amplifier circuit operating point and an output voltage of said power supply circuit are changed.

4. The audio amplifier according to claim 1, wherein said amplifier circuit has a variable bias circuit.

5. An audio amplifier for amplifying an input signal thereto comprising:
   a delay circuit for delaying an input signal to be amplified;
   an amplifier circuit having an amplification device for amplifying an output of said delay circuit, said amplifier circuit having a variable operating point;
   a level adjuster provided between said delay circuit and said amplifier circuit, for manually adjusting a level of the delayed signal to said amplifier circuit;
   a power supply circuit capable of changing a supply voltage to said amplifier circuit;
   a first peak-detecting circuit for detecting a level of said input signal;
   a second peak-detecting circuit for detecting a level of an input signal to said level adjuster;
   a third peak-detecting circuit for detecting a level of an output signal of said amplifier circuit;

a dividing circuit for dividing an output signal of said third peak-detecting circuit by an output signal of said second peak-detecting circuit; and a multiplying circuit for multiplying an output signal of said dividing circuit by an output signal of said first peak-detecting circuit, to output a signal for changing the operating point of said amplifier circuit and said supply voltage of said power supply circuit.

6. The audio amplifier according to claim 5, wherein said input signal is a digital input signal, and said amplifier further comprises:

a first digital-to-analog converter for converting an output signal of said delay circuit; and a second digital-to-analog converter for converting said digital input signal into an analog signal.

7. An audio amplifier for amplifying an input signal thereto comprising:

a delay circuit for delaying an input signal to be amplified;

an amplifier circuit having an amplification device for amplifying an output of said delay circuit, said amplifier circuit having a variable operating point;

a level adjuster provided between said delay circuit and said amplifier circuit, for manually adjusting a level of the delayed signal to said amplifier circuit;

a power supply capable of changing a supply voltage to said amplifier circuit;

a first peak-detecting circuit for detecting a level of said input signal;

a second peak-detecting circuit for detecting a level of an input signal to said level adjuster;

a third peak-detecting circuit for detecting a level of an output signal of said amplifier circuit;

a dividing circuit for dividing an output signal of said third peak-detecting circuit by an output signal of said second peak-detecting circuit;

a multiplying circuit for multiplying an output signal of said dividing circuit by an output signal of said first peak-detecting circuit to output a signal for changing the operating point of said amplifier circuit and said supply voltage of said power supply circuit; and a switching circuit means for selectively switching the output signal of said multiplying circuit and an output signal of said first peak-detecting circuit as a control signal for controlling the variation of the amplifier circuit operating point and the changing of the supply voltage to said amplifier circuit to thereby select the output signal of said multiplying circuit when said output signal of said second peak-detecting circuit becomes larger than a predetermined level, and to select the output signal of said first peak-detecting circuit when said output signal of said second peak-detecting circuit becomes smaller than the predetermined level.

* * * * *